(12) United States Patent
Sawada et al.

(10) Patent No.: US 10,881,033 B2
(45) Date of Patent: Dec. 29, 2020

(54) COOLING DEVICE

(71) Applicant: FANUC CORPORATION, Yamanashi (JP)

(72) Inventors: Takeshi Sawada, Yamanashi (JP); Fuyuki Ueno, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 200 days.

(21) Appl. No.: 15/710,993

(22) Filed: Sep. 21, 2017

(65) Prior Publication Data

US 2018/0088451 A1  Mar. 29, 2018

(30) Foreign Application Priority Data

Sep. 23, 2016  (JP) ................................. 2016-185704

(51) Int. Cl.
*H05K 7/20* (2006.01)
*G06F 1/20* (2006.01)
*H02K 9/04* (2006.01)
*H02K 9/26* (2006.01)
(Continued)

(52) U.S. Cl.
CPC ....... *H05K 7/20909* (2013.01); *F21V 29/677* (2015.01); *G03B 21/16* (2013.01); *G06F 1/20* (2013.01); *H02K 9/04* (2013.01); *H02K 9/26* (2013.01); *H05K 7/202* (2013.01); *H05K 7/2059* (2013.01); *H05K 7/20136* (2013.01); *H05K 7/20145* (2013.01); *H05K 7/20154* (2013.01); *H05K 7/20172* (2013.01); *H05K 7/20718* (2013.01); *H05K 7/20745* (2013.01);
(Continued)

(58) Field of Classification Search
CPC ............ G03B 21/16; H02K 9/04; H02K 9/26; H02K 11/33; G06F 1/20; H04N 9/3144; F16M 13/027; F16M 11/10; F21V 29/677; H05K 7/20909; H05K 7/20172; H05K 7/20827; H05K 7/20718; H05K 7/20154; H05K 7/20745; H05K 7/202; H05K 7/20136; H05K 7/2059; H05K 7/20145; H05K 7/206; H05K 7/20336; B23Q 11/10
See application file for complete search history.

(56) References Cited

U.S. PATENT DOCUMENTS 6,000,919 A * 12/1999 Hsieh .................... F04D 29/646
                                                              415/220
6,343,014 B1 * 1/2002 Lin ....................... H01L 23/467
                                                              165/121
2011/0109883 A1   5/2011 Ito
(Continued)

FOREIGN PATENT DOCUMENTS

DE    102015007357 A1   12/2015
JP      09-172281 A      6/1997
(Continued)

*Primary Examiner* — Anatoly Vortman
*Assistant Examiner* — Zhengfu J Feng
(74) *Attorney, Agent, or Firm* — Hauptman Ham, LLP

(57) ABSTRACT

A cooling device includes a fan for blowing air to a control board arranged on the downstream side by rotation of a rotator. The cooling device further includes a bypass structure provided so as to avoid the rotator and configured to oil liquid to flow, at least, from the upstream side of the fan to the downstream side of the fan, and a gutter provided on the upstream side of the fan to lead the oil liquid to the bypass structure.

14 Claims, 8 Drawing Sheets

(51) Int. Cl.
  *F21V 29/67*  (2015.01)
  *G03B 21/16*  (2006.01)
(52) U.S. Cl.
  CPC ......... *H05K 7/20827* (2013.01); *H05K 7/206* (2013.01); *H05K 7/20336* (2013.01)

(56) References Cited

U.S. PATENT DOCUMENTS

2011/0198973 A1* 8/2011 Hirano ................. H05K 5/0213
                                                  312/236
2013/0300946 A1  11/2013 Manabe et al.
2014/0085820 A1*  3/2014 Yamamoto ......... H05K 7/20909
                                                  361/695
2018/0071676 A1*  3/2018 Sakikawa ................ B01J 20/26

FOREIGN PATENT DOCUMENTS

| JP | 2000-77876 | A |   | 3/2000 |
|----|------------|---|---|--------|
| JP | 2007-48946 | A |   | 2/2007 |
| JP | 2009-187977 | A |   | 8/2009 |
| JP | 2010017823 | A | * | 1/2010 |
| JP | 4846207 | B2 |   | 12/2011 |
| JP | 5023393 | B2 |   | 9/2012 |
| JP | 2013-235188 | A |   | 11/2013 |
| JP | 2014-72211 | A |   | 4/2014 |
| JP | 2014-136997 | A |   | 7/2014 |
| WO | 2009/153871 | A1 |   | 12/2009 |

\* cited by examiner

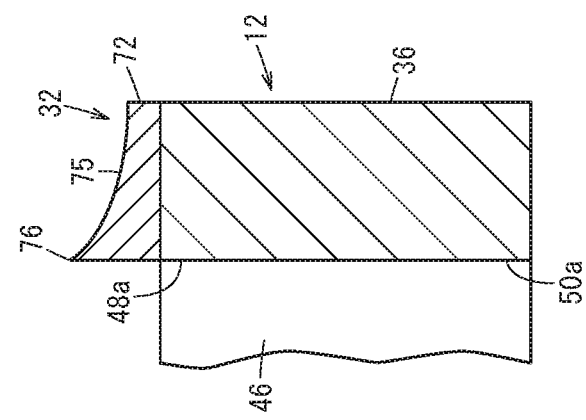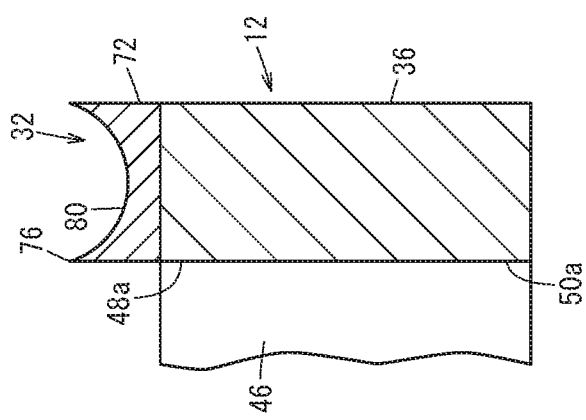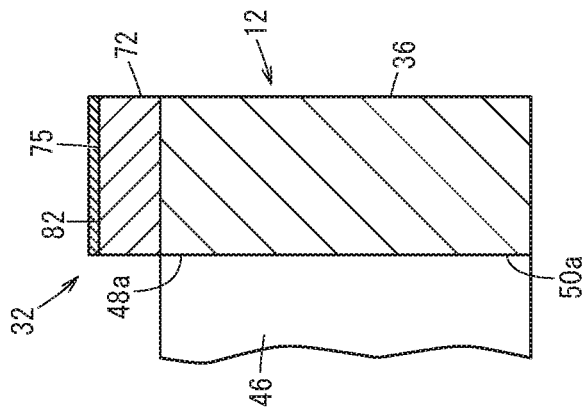

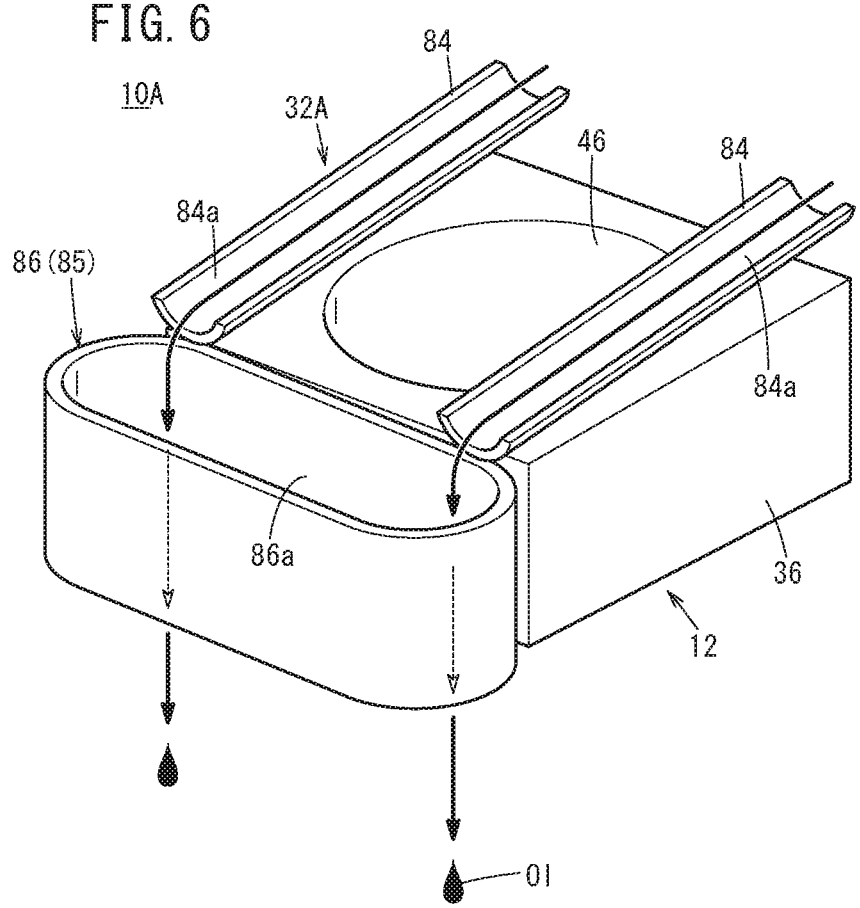

COOLING DEVICE

CROSS-REFERENCE TO RELATED APPLICATION

This application is based upon and claims the benefit of priority from Japanese Patent Application No. 2016-185704 filed on Sep. 23, 2016, the contents of which are incorporated herein by reference.

BACKGROUND OF THE INVENTION

Field of the Invention

The present invention relates to a cooling device that cools a target object by blowing air thereto.

Description of the Related Art

The metal machining apparatus uses a cutting fluid (oil) for cutting work and the like, so that the cutting fluid splashes and scatters in the form of mist in the air around the apparatus. Therefore, when air is blown by the fan in order to cool a control board (target object) or the like in the machining apparatus, the oil mist is also drawn into the fan, and then adheres to and solidifies on the fan, which may cause malfunction of the fan. Further, in some cases, the oil mist enters the machining apparatus through the fan, and the oil mist adheres to the control board or other interior devices, so that malfunction may occur in the apparatus itself.

In order to solve the above problems, Japanese Laid-Open Patent Publication No. 2013-235188 discloses an image display device configured to suppress the blowing of foreign materials into interior devices due to a fan. This image and further includes a bay-shaped portion on the downstream side of the fan to trap foreign materials.

SUMMARY OF THE INVENTION

However, in the image display device disclosed in Japanese Laid-Open Patent Publication No. 2013-235188, a large amount of oil mist is collected in the filter on the upstream side of the fan, so that the filter needs to be replaced at an early stage, or maintained at short intervals. In addition, the oil mist having flowed past the filter easily adheres to the fan, which may cause malfunction of the fan.

The present invention has been devised in view of the above circumstances, it is therefore an object of the present invention to provide a cooling device having a simple configuration that can stably cool a target object while substantially suppressing the adhesion of liquid to a fan and the target object and save time and labor for maintenance.

In order to achieve the above object, a cooling device of the present invention includes: a fan configured to blow gas to a target object disposed on the downstream side of the fan by rotation of a rotator; a bypass structure provided so as to avoid the rotator and configured to allow a liquid to flow, at least, from the upstream side of the fan to the downstream side of the fan; and a gutter provided above the rotator and configured to lead the liquid to the bypass structure.

According to the above, since the cooling device includes the bypass structure and the gutter, even if the gas residing on the upstream side of the fan contains therein a liquid (oil mist etc.), it is possible to catch the liquid by means of the gutter and flow the liquid along the gutter. The liquid flowing through the gutter flows into the bypass structure and moves from the upstream side to the downstream side of the fan. That is, the cooling device can not only suppress adhesion of the liquid to the fan, but also inhibit the rotator from scattering the liquid on the target object by its rotation. Accordingly, the cooling device can cool the target object stably and reduce the time and labor for maintenance.

In this case, it is preferable to provide a gas-liquid separation mechanism that separates the liquid contained in the gas, on the upstream side of the fan.

Since the cooling device includes the gas-liquid separation mechanism, it is possible to separate the gas and the liquid on the upstream side of the fan to a certain extent. Therefore, it is possible to further suppress adhesion of the liquid to the fan and the target object.

In addition to the above configuration, it is preferable that the gas-liquid separation mechanism contains therein a first space having a structure configured to separate the gas and the liquid from each other, and a second space communicating with the first space and configured to supply the gas having passed through the first space, to the fan, and the gutter is arranged in the second space.

Thus, since the gutter is arranged in the second space of the gas-liquid separation mechanism, it is possible to favorably discharge the liquid flowing into the second space by way of the gutter and the bypass structure.

It is also preferable that the upper part of the gutter is inclined so as to become gradually lower toward the bypass structure.

Thus, since the upper part of the gutter is inclined, it is possible for the trapped liquid to smoothly flow to the bypass structure.

Further, it is preferable that the gutter extends along the circumferential direction of the fan.

Thus, since the gutter extends along the circumferential direction of the fan, the gutter can reliably receive the liquid which adheres to the walls around the fan and falls down along the walls.

The gutter may be formed to sparsely cover the upstream side of the fan.

Thus, since the gutter is formed so as to sparsely cover the upstream side of the fan, it is possible to receive the liquid on the upstream side of the fan, and the gutter also can play a role of a finger guard.

It is also preferable to provide a projected portion that is projected on the inner side of the gutter and extends along the gutter, on the upstream side of the gutter.

Thus, since the projected portion is provided on the inner side of the gutter, it is possible to more reliably prevent the liquid flowing through the gutter from flowing beyond the projected portion and then leaking out into the rotator.

Herein, it is preferable that the fan has a housing configured to accommodate the rotator in a rotatable manner, and the bypass structure is arranged in a part of the housing that is separated from the rotator and has a through hole penetrating from the upstream to the downstream of the housing.

Thus, since the bypass structure is provided in a part of the housing of the fan, it is possible to simplify the formation of a structure that allows the liquid to flow downstream of the fan and also save the space of the cooling device.

Further, the bypass structure may include a discharging member having a long hole elongated along a side of the fan at the lateral side of the fan.

Thus, since the bypass structure is equipped with the discharging member, it is possible to easily receive the liquid having flowed through the gutter, by means of the long hole and flow the received liquid downward of the fan.

Further, it is preferable that the bypass structure includes a flow guide member configured to guide the liquid having flowed to the downstream side of the fan, to the inner side surface of a casing with the target object accommodated therein.

Thus, since the cooling device includes the flow guide member, it is possible to prevent the liquid having flowed downstream of the fan from dripping, and flow the liquid along the inner side surface of the casing. Therefore, it is possible to prevent scattering of the liquid and more reliably suppress adhesion of the liquid to the target object.

According to the present invention, the cooling device, with a simple configuration, can stably cool a target object while substantially suppressing the adhesion of liquid to a fan and the target object, and save time and labor for maintenance.

The above and other objects features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5A is a sectional view taken along a line VA-VA in FIG. 3;

FIG. 5B is a sectional view of a gutter according to another configuration example;

FIG. 5C is a sectional view of a gutter according to still another configuration example;

FIG. 6 is a perspective view showing a fan, a gutter, and a discharging member of a cooling device according to a first modification example;

DESCRIPTION OF THE PREFERRED EMBODIMENTS

Preferred embodiments of the cooling device according to the present invention will be described hereinbelow in detail with reference to the accompanying drawings.

Figure 1:
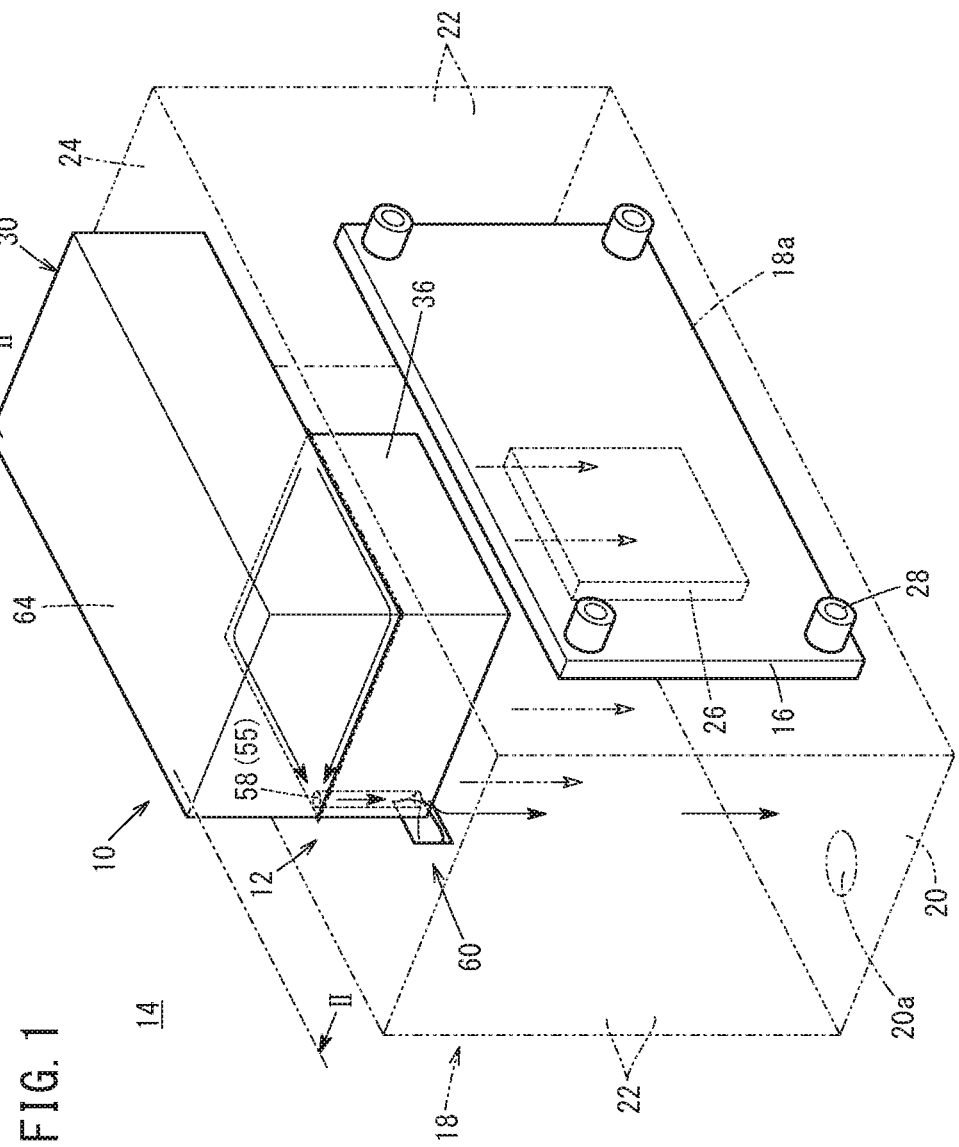
FIG. 1 is a perspective view schematically showing the overall configuration of a controller to which a cooling device according to one embodiment of the present invention is attached.
Figure 2:
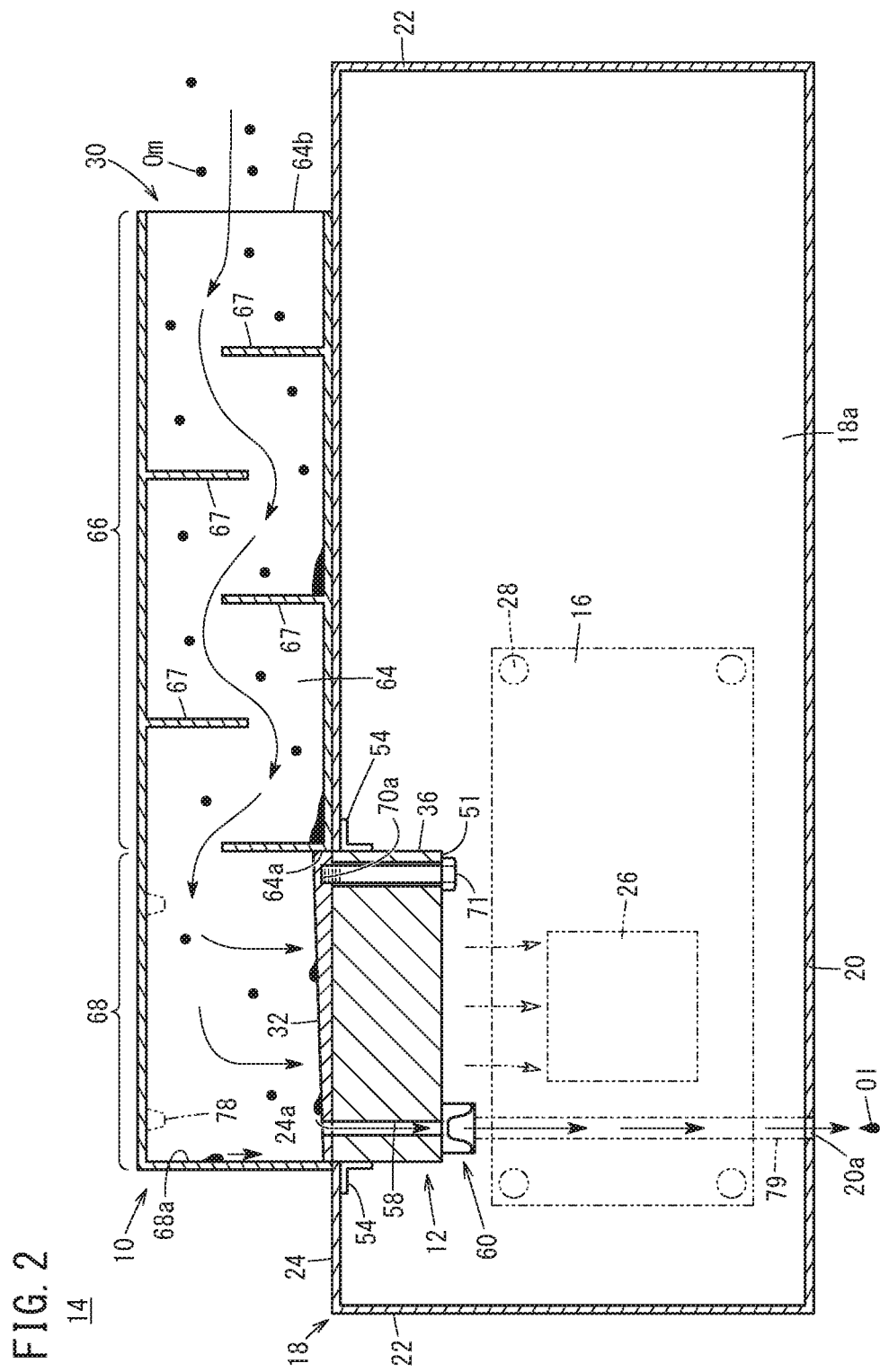
FIG. 2 is a sectional view taken along a line II-II for illustrating main components of the cooling device of FIG. 1.

As shown in FIGS. 1 and 2, a cooling device according to one embodiment of the present invention is a device that cools a target object by blowing air (gas: see two-dot chain lined arrows in FIG. 1) by means of a fan 12. For example, the cooling device 10 is provided in a controller 14 of a machine tool for cutting metal and the like in a metal working factory, and cools a control board 16 as a target object to be cooled which is accommodated in the controller 14, to thereby suppress rise in temperature.

As described above, the cutting fluid (liquid: oil liquid Ol) used for metal working is scattered in the form of oil mist Om in the air inside the metal working factory. The cooling device 10 suppresses the oil liquid Ol (see thin solid lined arrows in FIG. 1) from adhering to the fan 12 and the control board 16 in an environment where the oil mist Om is scattered, so as to operate the fan 12 and the control board 16 stably.

Note that the object to be cooled by the cooling device 10 is not limited to the control board 16 in the controller 14, but can be applied to various kinds of items (electronic devices, heat sinks for heat radiation, products, etc.) that require air cooling. The apparatus and location where the cooling device 10 is installed can also be arbitrarily selected depending on the target object.

The controller 14 includes a casing 18 for accommodating the control board 16 and is attached to a predetermined position of the machine tool. The casing 18 is formed in a box shape (rectangular parallelepiped, etc.) and made of, for example, a hard resin material or a metal material. The casing 18 has a rectangular bottom plate 20 disposed on the lower side with respect to the direction of gravity in the installed state of the controller 14, four side plates 22 erected upward and contiguous from respective sides of the bottom plate 20, and a ceiling plate 24 supported by the side plates 22 and provided above the bottom plate 20. In an interior defined by the bottom plate 20, the four side plates 22 and the ceiling plate 24, a hollow space 18a is provided in which the cooling device 10 and the control board 16 can be arranged apart from each other.

The control board 16 accommodated in the casing 18 constitutes a computer having, for example, a processor 26, a memory, an input/output interface, various electronic devices and the like to control driving of the machine tool. The control board 16 is mounted on an inner surface of one of the four side plates 22 (the one side plate 22 opposite to a side plate 22 on which an aftermentioned flow guide member 60 is arranged). Further, the control board 16 is firmly fixed in a state separating from the side plate 22 (with a clearance in-between) by multiple of spacers 28, and is arranged apart from the bottom plate 20.

Further, the bottom plate 20 is formed with a drain port 20a for discharging the liquefied oil liquid Ol to the outside of the casing 18. The oil liquid Ol discharged to the outside of the casing 18 from the drain port 20a is collected by a collection unit (not shown). It should be noted that the bottom plate 20 is preferably inclined such that the oil flows toward the drain port 20a.

The cooling device 10 is attached to the ceiling plate 24 of the casing 18. The ceiling plate 24 is formed with an attachment opening 24a through which the fan 12 of the cooling device 10 is inserted and mounted. The cooling device 10 may be disposed at a position shifted from the right above of the control board 16. The cooling device 10 and the control board 16 may be disposed so as to face each other (for example, the control board 16 may be provided on the bottom plate 20). In addition, an exhaust port (not shown) for discharging air in the hollow space 18a to outside of the casing 18 is preferably formed in the casing 18.

Figure 3:
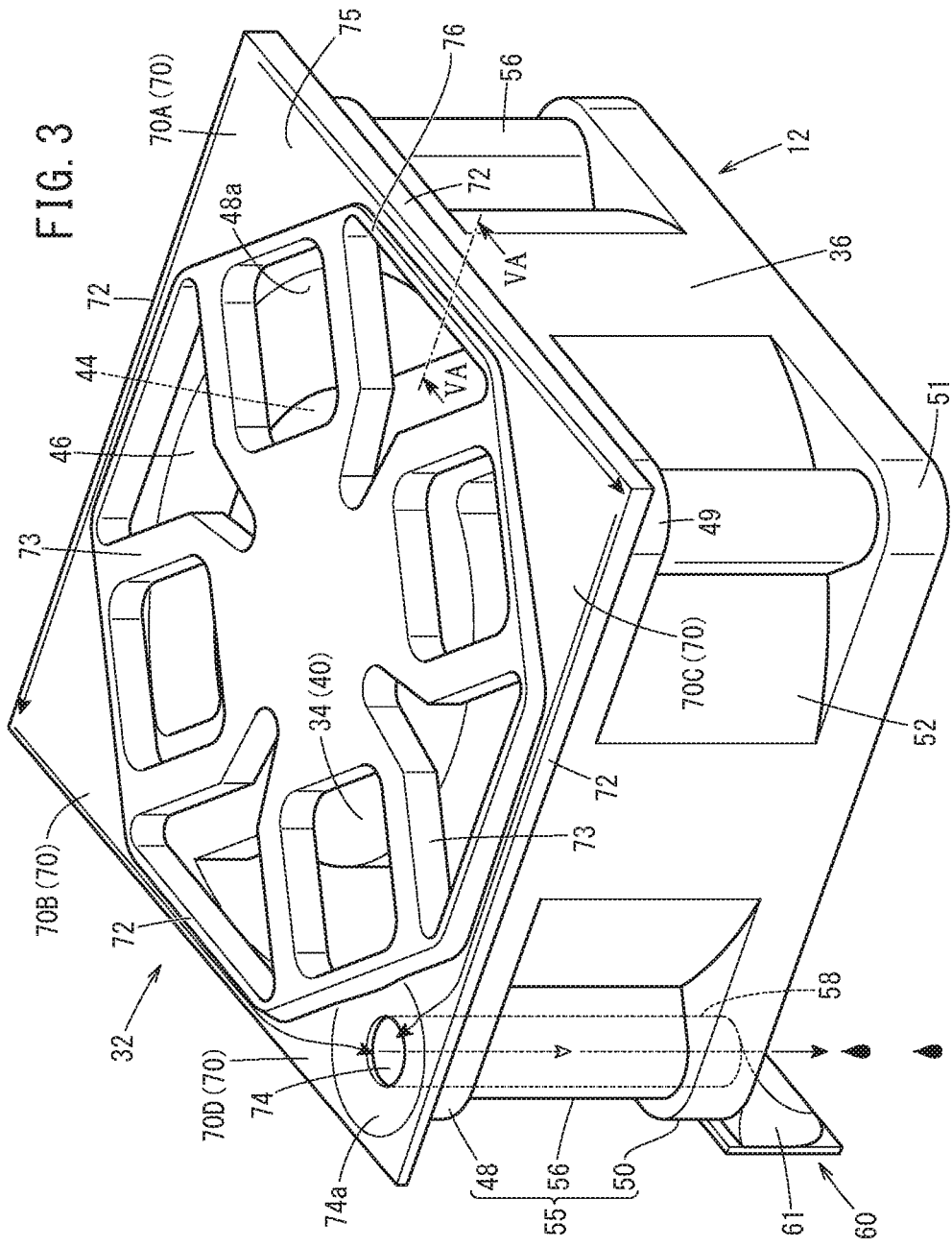
FIG. 3 is a perspective view of a fan and a gutter in FIG. 1 as viewed from above.

The cooling device 10 attached to the casing 18 is connected to the control board 16 via wires (not shown) and operated under the control of the control board 16 so as to blow air toward the control board 16 (mainly the processor 26). Thus, the control board 16 in operation is cooled. As shown in. FIGS. 2 and 3, this cooling device 10 includes the above-described fan 12, a gas-liquid separation mechanism 30 to which the fan 12 is attached, and a gutter 32 provided on the upper face of the fan 12.

The fan 12 forms the essential part of the cooling device 10 for actually blowing air. The fan 12 has a rotator 34 and a housing 36 that accommodates the rotator 34 therein.

The rotator 34 includes a cylindrical shaft 40 and a plurality of blades 42 (see FIG. 8) projecting from the side surface of the shaft 40. The shaft 40 forms a rotor of a motor mechanism 44, and has a permanent magnet (not shown) arranged on an inner surface of the cylinder. The shaft 40 rotates clockwise or counterclockwise by supplying electric power to a coil (not shown) of the motor mechanism 44 disposed further inward. Since the multiple blades 42 are formed in a prescribed curved shape, upper air is blown downward as the shaft 40 rotates.

The housing 36 defines a mounting space 46 for rotatably accommodating the rotator 34 and provides a function of fixing the fan 12 to the casing 18. Specifically, as shown in FIG. 3, the housing 36 includes an upper frame 48, a lower frame 50, a tubular frame 52 which is arranged between the upper frame 48 and the lower frame 50 and surrounds a lateral side of the rotator 34, and defines the mounting space 46 that penetrates through each frame vertically. The housing 36 and the casing 18 (the ceiling plate 24 and the side plates 22) are firmly fastened by screwing or the like via fixing members 54 (see FIG. 2).

Figure 4:
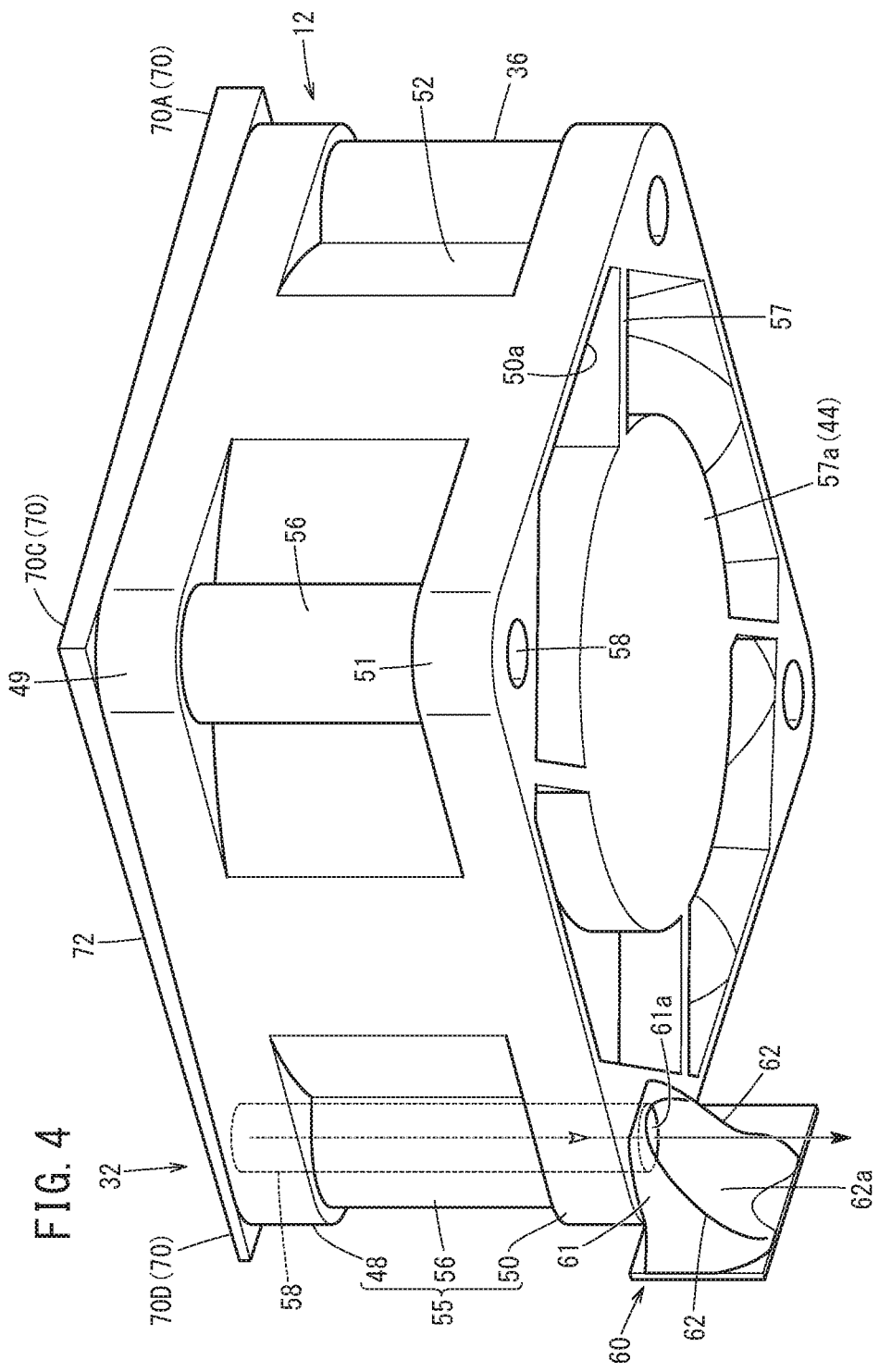
FIG. 4 is a perspective view of a fan and a flow guide member of FIG. 1 as viewed from below.

As shown in FIGS. 3 and 4, the upper frame 48 and the lower frame 50 have predetermined thickness in the vertical direction and are formed in a square shape with four corners rounded in a plan view or when viewed from the direction of the center axis of the rotator 34. The upper and lower frames 48 and 50 have respective openings 48a and 50a thereinside, which communicate respectively with the top and bottom of the mounting space 46. Each of the four corners in each of the upper and lower frames 48 and 50 is separated away from the contour of the opening 48a, 50a, so that each corner portion 49, 51 assumes an approximately triangular shape. A support frame 56 vertically extending is arranged between each pair of corner portions 49 and 51 of the upper and lower frames 48 and 50.

The four support frames 56 (at the four corners) each have a substantially cylindrical shape and are formed contiguously with the outer peripheral surface of the tubular frame 52. Inside each of the support frames 56 inclusive of the upper and lower frames 48 and 50, a through hole 58 is formed that penetrates therethrough in the vertical direction. Primarily, these four through holes 58 are provided for the purpose of screw-fixing between the housing 36 and the gutter 32, but in the present embodiment, one through hole 58 is used as a flow passage for flowing oil liquid Ol. That is, the cooling device 10 uses one corner (corner portions 49, 51 and support frame 56) of the housing 36 with the through hole 58 as a bypass structure 55 for flowing the oil liquid Ol.

As shown in FIG. 4, the lower frame 50 has arms 57 that are projected from the inside of the corner portions 51 toward the center of the opening 50a, and joined to and support a support member 57a. This support member 57a constitutes a stator having a coil of the motor mechanism 44, and rotatably supports the shaft 40 of the rotator 34. Further, at a predetermined corner portion 51 of the lower frame 50, a flow guide member 60 is provided that is fixed to one of the side plates 22 (the side plate 22 facing the control board 16) to support the fan 12.

The flow guide member 60 has an annular projecting supporter 61, which protrudes from the side plate 22 to the corner portion 51 on an upper side thereof. The projecting supporter 61 has a hole 61a that communicates with the through hole 58. A pair of protrusions 62 extending downward from the projecting supporter 61 are provided on a lower side of the flow guide member 60. Between the protrusions 62, a groove 62a is formed so as to be connected to the inner surface of the hole 61a. The groove 62a is inclined from the hole 61a toward the side plate 22 as it goes downward and smoothly joins to the side plate 22.

Returning to FIG. 2, the gas-liquid separation mechanism 30 of the cooling device 10 is arranged over an upper portion of the fan 12 and an outer upper portion of the casing 18, forming an air supply path through which air is delivered to the fan 12 on the upstream side of the air flow direction when the cooling device 10 is operated. Further, the gas-liquid separation mechanism 30 has a function of separating oil mist Om contained in the air.

Specifically, the gas-liquid separation mechanism 30 is formed into a rectangular parallelepiped shape having an air flow space 64 therein. In the bottom on one end side of the gas-liquid separation mechanism 30 (the attachment portion attached to the ceiling plate 24 of the casing 18), a fan opening 64a is formed that establishes communication between the flow space 64 and the mounting space 46 of the fan 12.

Further, the gas-liquid separation mechanism 30 is placed so as to extend in the horizontal direction (the direction orthogonal to the vertical direction) from the one end portion toward the other end portion, and has a length in the extending direction, which is sufficiently longer than the width of the fan 12 (for example, twice or more the width of the fan). On a side surface of the other end portion, an inlet port 64b that establishes communication between the outside of the gas-liquid separation mechanism 30 and the flow space 64 is formed.

The flow space 64 of the gas-liquid separating mechanism 30 is composed of a first space 66 formed on a section extending from the inlet port 64b and under which the fan 12 does not exist, and a second space 68 formed on another section located over the fan opening 64a (under which the fan 12 exists).

Inside the first space 66 of the gas-liquid separation mechanism 30, a plurality of protruding walls 67 are formed. These multiple protruding walls 67 are projected alternately downward from the top and upward from the bottom, forming a labyrinth structure in the air supply path. Therefore, the air drawn from the inlet port 64b by the suction force of the fan 12 flows zigzag or up and down while moving in the lateral direction. At this time, the multiple protruding walls 67 catch oil mist Om contained in the air so as to aggregate the mist into oil liquid Ol. Thus, the oil mist Om is prevented from flowing into the second space 68.

The second space 68 communicates with the first space 66 and is formed so as to have a certain volume. The air from the first space 66 is supplied to the fan 12 through the second space 68. As described above, the oil mist Om is basically separated from the air in the first space 66, but part of the oil mist Om having passed through the first space 66 flows into the second space 68 and adheres to an inner side surface 68a of the second space 68 in the gas-liquid separation mechanism 30.

On the other hand, the gutter 32 is fixed to the upper portion (upstream side) of the fan 12. The gutter 32 receives the oil mist Om adhering to the inner side surface 68a of the second space 68 to discharge it as oil liquid Ol and prevents the oil liquid Ol from adhering and solidifying on the rotator 34. The gutter 32 is disposed under the second space 68 of the gas-liquid separation mechanism 30 in a state where both the fan 12 and the gas-liquid separation mechanism 30 are attached to the ceiling plate 24 of the casing 18.

As shown in FIG. 3, the gutter 32 is formed in a shape (square shape in plan view) approximately congruent with the upper frame 48 of the fan 12. The gutter 32 includes four triangular portions 70 respectively arranged at the four corner portions 49 of the upper frame 48, four bridge frames 72 for mutually joining the circumferentially adjacent triangular portions 70, and a guard frame 73 arranged inside the triangular portions 70 and the bridge frames 72. The triangular portions 70, the bridge frames 72 and the guard frames 73 are connected with one another to form a single member. The gutter 32 and the housing 36 are fixed together by, for example, screwing fixing bolts 71 inserted from the through holes 58 of the housing 36 into female screw portions 70a formed on the underside of the triangular portions 70 (see FIG. 2).

Further, the gutter 32 is configured such that its upper surface is gently inclined by varying the thickness (height) in the vertical direction. More specifically, in the upper surface, the outer vertex of one triangular portion 70 is highest, while the outer vertex of another triangular portion 70 that is located on the opposite diagonal side is lowest. That is, the upper surface is gradually lowered from the outer vertex of the one triangular portion 70, toward the outer vertex of the other triangular portion 70. Hereinafter, the highest triangular portion 70 is referred to as a first triangular portion 70A, the triangular portions 70 circumferentially adjacent to the first triangular portion 70A are referred to as a second triangular portion 70B and a third triangular portion 70C, and the lowest triangular portion 70 adjacent to the second and third triangular portions 70B and 70C is referred to as a fourth triangular portion 70D. Similarly, the bridge frames 72 joining the first to fourth triangular portions 70A to 70D also are also varied in thickness such that the gutter 32 is inclined correspondingly.

As described above, since the gutter 32 is inclined so as to become lower toward the fourth triangular portion 70D, the oil liquid Ol (oil mist Om) adhering to the upper area can be made to flow to the fourth triangular portion 70D. An outlet port 74 connected to the through hole 58 of the fan. 12 is formed in the fourth triangular portion 70D. The outlet port 74 allows the oil liquid Ol having flowed down along the first to fourth triangular portions 70A to 70D and the bridge frames 72 to flow out to the through hole 58. The periphery of the outlet port 74 is formed with a tapered portion 74a which is inclined downward toward the axial center of the outlet port 74. This configuration promotes the oil liquid Ol to flow to the outlet port 74.

In addition, in a sectional view (see FIG. 5A), the upper part of the gutter 32 is formed with a flat portion 75 on the outer side in the width direction, and a projected portion 76 protruding upward from the flat portion 75 on the inner side in the width direction. FIG. 5A shows a sectional view of the bridge frame 72 taken along a plane orthogonal to the longitudinal direction thereof, but each triangular portion 70 also has the flat portion 75 and projected portion 76 formed thereinside. Therefore, the upper part of the gutter 32 allows the oil liquid Ol to flow along the flat portion 75. The projected portion 76 only projects somewhat with respect to the flat portion 75, but sufficiently blocks the oil liquid Ol from leaking into the opening 48a of the upper frame 48.

The guard frame 73 of the gutter 32 is provided to prevent the operator's fingers from touching the rotator 34. For example, the guard frame 73 is constructed such that its parts protrude inward from the respective triangular portions 70 and are connected in the center, thereby preventing the fingers from passing through while sufficiently ensuring the communicating performance of the openings 48a. The shape of the guard frame 73 is not particularly limited or the guard frame 73 may not be provided either. Alternatively, another finger guard (not shown) may be interposed and fixed between the upper portion of the fan 12 and the gutter 32 while the gutter 32 may be formed of four triangular portions 70 and four bridge frames 72.

The cooling device 10 according to the present embodiment is basically configured as described above, and the operation and effect thereof will be described hereinbelow.

As described above, the cooling device 10 is used to cool the control board 16 in the controller 14 of the machine tool. As shown in FIGS. 1 and 2, the fan 12 of the cooling device 10 rotates under the control of the control board 16 and blow air onto the control board 16. At this time, the gas-liquid separation mechanism 30 of the cooling device 10 takes in air from the outside of the casing 18 by the suctioning action by rotation of the rotator 34.

In the gas-liquid separation mechanism 30, the oil mist Om contained in the air is collected by the multiple protruding walls 67 (labyrinth structure) in the first space 66 so as to prevent the oil mist Om from flowing into the second space 68. If the gas-liquid separation mechanism 30 is detachably attached to the casing 18, at the time of maintenance, the oil mist Om can be easily discarded simply by removing the gas-liquid separating mechanism 30 from the casing 18 without opening the casing 18.

When the oil mist Om flows into the second space 68 (that is, the space above the fan 12) in the gas-liquid separation mechanism 30, the oil mist Om is trapped by the gutter 32, whereby adhesion of the oil mist Om to the rotator 34 is suppressed. That is, the oil mist Om adhering to the inner side surface 68a of the gas-liquid separation mechanism 30 constituting the second space 68 gathers together to a certain degree and turns into oil liquid Ol, which flows downward along the inner side surface 68a.

In the upper part of the gutter 32, the flat portion 75 receives the oil liquid Ol flowing down from the inner side surface 68a, and the oil liquid is made to flow along the circumferential direction of the gutter 32 without going beyond the projected portion 76. Therefore, the oil liquid Ol flows along the extending direction of the gutter 32 without leakage into the rotator 34. In addition, since the gutter 32 is inclined so as to become lower toward the fourth triangular portion 70D, the oil liquid Ol on the first to third triangular portions 70A to 70C and the bridge frames 72 is made to flow toward the fourth triangular portion 70D.

The oil liquid Ol having reached the fourth triangular portion 70D flows into the outlet port 74 along the tapered portion 74a and flows out to the through hole 58 of the housing 36 (bypass structure 55) communicating with the outlet port 74. Further, the oil liquid Ol moves downward through the through hole 58 and flows from the through hole 58 through the hole 61a and the groove 62a of the flow guide member 60. Since the groove 62a is inclined toward the side plate 22, the oil liquid Ol smoothly transfers to the side plate 22. Then, the oil liquid Ol flows downward along the side plate 22 and reaches the bottom plate 20. That is, since no oil liquid Ol falls from the fan 12 in the hollow space 18a and splashes, adhesion of the oil to the control board 16 is suppressed. The oil liquid Ol flowing to the bottom plate 20 is drained to the outside of the casing 18 via the drain port. 20a provided in the bottom plate 20.

As described above, the cooling device 10 according to the present embodiment has the gutter 32 and the bypass structure 55 so that the oil mist Om above the fan 12 can be received by the gutter 32 and made to flow therealong. The oil liquid Ol transferred through the gutter 32 flows into the through hole 58 and moves from the upper side to the lower side of the fan 12. This makes it possible for the cooling device 10 to suppress adhesion of the oil liquid Ol to the rotator 34 and inhibit blowing of the oil mist Om on the control board 16. Therefore, the cooling device 10 can stably cool the control board 16 and reduce the time and labor for maintenance.

Since the cooling device 10 includes the gas-liquid separation mechanism 30, it is possible to separate the oil mist Om from the air to some extent on the upstream side of the fan 12. Therefore, it is possible to further suppress adhesion of the oil liquid Ol to the fan 12 and the control board 16. Since the gutter 32 is disposed in the second space 68 of the gas-liquid separation mechanism 30, the oil mist Om that has flowed into the second space 68 can be discharged favorably by the gutter 32 and the bypass structure 55.

Since the upper part of the gutter 32 is inclined, the received oil liquid Ol can be made to smoothly flow into the bypass structure 55. Furthermore, since the gutter 32 extends along the circumferential direction of the fan 12, the gutter 32 can reliably receive the oil mist Om which adheres to the inner side surface 68a of the gas-liquid separation mechanism 30 and falls down. Furthermore, since the projected portion 76 is formed in the upper part of the gutter 32, it is possible to more reliably prevent the oil liquid Ol flowing through the gutter 32 from moving beyond the projected portion 76 and then leaking out into the rotator 34.

In addition, provision of the bypass structure 55 in a part of the housing 36 of the fan 12 makes it possible to simplify the formation of a structure that allows the liquid to flow downward of the fan 12 and also save the space of the cooling device 10. Furthermore, since the cooling device 10 is equipped with the flow guide member 60, it is possible to prevent the oil liquid Ol having flowed downward below the fan 12 from dripping and flow the oil liquid along the inner side surface (the inner surface of the side plate 22) of the casing 18. Therefore, it is possible to prevent scattering of the oil liquid Ol and more reliably suppress adhesion of the oil liquid Ol to the control board 16.

It should be noted that the cooling device 10 is not limited to the above-described configuration but can take various modified and applied modes. For example, in the present embodiment, the fan 12 and the gutter 32 are separately formed, but the housing 36 of the fan 12 and the gutter 32 may be integrally molded. Further, for example, the gas-liquid separation mechanism 30 of the cooling device 10 is not limited to the one having the above-described labyrinth structure, and various structures can be used as long as they can separate the oil mist Om contained in the air. The gas-liquid separation mechanism 30 may be installed in the casing 18, that is, the cooling device 10 as a whole may be installed in the casing 18.

In addition, the gas-liquid separation mechanism 30 may have a flow path for allowing the oil liquid Ol separated from the gas in the first space 66 to flow toward the gutter 32. With this configuration, the oil liquid Ol separated in the flow space 64 can flow along the gutter 32, the through hole 58, and the interior surface of the casing 18 (the side plate 22), and then can be discharged from the drain port 20a. Alternatively, the cooling device 10 may not necessarily include the gas-liquid separation mechanism 30. That is, even only by providing the gutter 32 which traps and discharges the oil liquid Ol adhering to the components provided above the gutter 32, it is possible to reduce adhesion of the oil liquid Ol to the rotator 34.

Further, as indicated by the two-dot chain line in FIG. 2, a structure (protrusions 78) that facilitates dropping down of the oil liquid Ol on the gutter 32 may be provided on the upper inner surface of the second space 68 of the gas-liquid separation mechanism 30. That is, the protrusion 78 is located right above the gutter 32 and protrudes downward, whereby the oil mist Om in contact with the upper inner surface aggregates at the protrusion, and the oil drips onto the upper part of the gutter 32. Other than the formation of protrusions 78, for example, the upper inner surface may be formed to be hemispherical or the like so as to move the oil mist Om to the inner side surface 68a of the gas-liquid separation mechanism 30.

Moreover, the arrangement of the bypass structure 55 is not limited to one corner of the housing 36 having the through hole 58, but a flow groove may be provided on the side face of the housing 36. Still more, as shown by the two-dot chain line in FIG. 2, as another flow guide member, a flexible drain tube 79 may be attached on the lower side of the through hole 58 of the fan 12 in order to discharge the oil liquid Ol downward. Here, the drain tube 79 may be directly attached to the gutter 32 (the outlet port 74) so as to function as part of the bypass structure 55 for flowing out the oil liquid Ol directly from the gutter 32. Alternatively, a guide rod, a hard pipe, a guide groove provided in the side plate 22, or the like may be adopted as another flow guide member than the flow guide member 60.

Further, for example, in the present embodiment, the upper part of the gutter 32 is configured to have the flat portion 75 and the projected portion 76 (see FIG. 5A), but the present invention is not limited to this structure. As cross-sectionally shown in FIG. 5B, the upper part of the gutter 32 may have a flow groove 80 recessed downward. Alternatively, as cross-sectionally shown in FIG. 5C, the upper part of the gutter 32 may be formed with a simple flat surface (flat portion 75) without any projected portion 76. Even with this structure, it is possible to suppress leakage of the oil liquid Ol to the rotator 34 and appropriately flow the oil liquid along the gutter, owing to the tension of the oil and other factors. In short, the upper part of the gutter 32 may adopt various shapes that enable the oil liquid Ol to flow. Further, as shown in FIG. 5C, a coating layer 82 for smoothly flowing the oil liquid Ol may be provided on the upper portion of the gutter 32. Of course, the coating layer 82 may be provided for other upper configurations (e.g., the gutters 32 shown in FIGS. 5A and 5B).

Modification Example 1

A cooling device 10A according to the first modification example shown in FIG. 6 is different from the cooling device 10 according to the present embodiment in that a pair of semi-cylindrical members 84 are provided as a gutter 32A above the fan 12 (housing 36) while a discharging member 86 (bypass structure 85) that flows the oil liquid Ol downward below the fan 12 is arranged on the side of the housing 36. In the following description, the components having the same structures or the same functions as those in the aforementioned cooling device 10 are allotted with the same reference numerals and description thereof is omitted.

The pair of semi-cylindrical members 84 extend over the housing 36 in parallel to each other from the first space 66 (see FIG. 2) side toward the inner side surface 68a on one end side of the gas-liquid separation mechanism 30, and one end of each semi-cylindrical members is joined to and supported on the upper part of the discharging member 86. Further, the outer side surface of each semi-cylindrical member 84 is in contact with the inner side surface 68a of the second space 68 so as to be able to receive the oil liquid Ol from the inner side surface 68a. Each of the semi-cylindrical members 84 is formed in a circular arc shape in a sectional view orthogonal to the extending direction, and the oil liquid Ol flows along the semi-cylindrical members 84 to the discharging member 86 through a recessed groove 84a formed on the inner surface side.

Further, the pair of semi-cylindrical members 84 are attached so as to be inclined downwards at the same angle toward the discharging member 86. That is, the gutter 32A is separated away from the housing 36. As a result, the fan 12 and the gutter 32A can be handled as separate members without contact to each other, and the gutter 32A can be easily taken out for maintenance and the like. Each semi-cylindrical member 84 may be configured to be adjustable in angle with one end side connected to the discharging member 86 as a reference point.

The discharging member 86 is formed into a flat elliptical shape extending along the side of the fan 12 in plan view and having a major axis longer than the width of the housing 36. An elongated long hole 86a is provided therein along the width of the fan 12. The length of the discharging member 86 in the vertical direction is greater than the thickness of the fan 12, and the long hole 86a is formed to penetrate through the discharging member 86 in the vertical direction. The long hole 86a receives the oil liquid Ol having flowed through the recessed grooves 84a of the pair of semi-cylindrical members 84 and leads the oil downward below the fan 12 (to the bottom plate 20). Note that the discharging member 86 may extend to the bottom plate 20 of the casing 18.

As described above, the effect similar to that of the above-described cooling device 10 can be obtained also in the gutter 32A (the pair of semi-cylindrical members 84) and the discharging member 86 (the bypass structure 85) according to the first modification example. In particular, the discharging member 86 can easily and reliably receive the oil liquid Ol having flowed through the pair of semi-cylindrical members 84 by means of the long hole 86a and flow the oil downward below the fan 12. It should be noted that only one or three or more semi-cylindrical members 84 may be provided above the fan 12.

Modification Example 2

Figure 7:
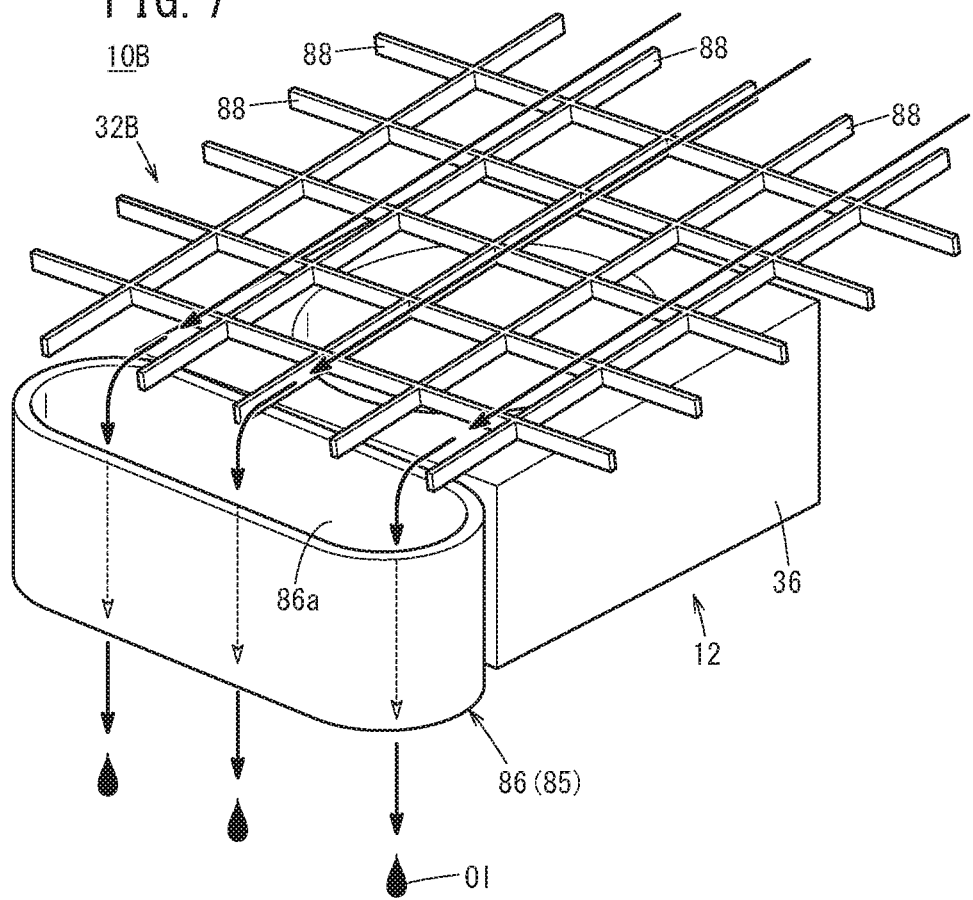
FIG. 7 is a perspective view showing a fan, a gutter, and a discharging member of a cooling device according to a second modification example.

A cooling device 10B according to the second modification example shown in FIG. 7 uses the same discharging member 86 as in the first modification example, but is different from the above-described cooling devices 10, 10A, in that a gutter 32B is formed by assembling rods 88 in a lattice structure. The fan 12 and the gas-liquid separation mechanism 30 are the same as those in the cooling device 10.

The gutter 32B is arranged such that the lattice of rods 88 is inclined downward toward the discharging member 86 while ends of the rods 88 orthogonal to the major axis of the discharging member 86 are positioned above the long hole 86a of the discharging member 86. The lattice of rods 88 allows air to flow above the fan 12 while collecting the oil mist Om so that the collected oil mist Om flows as oil liquid Ol along the rods 88 in the extending direction thereof. That is, the gutter 32B itself has a certain degree of gas-liquid separation function and flows the separated oil liquid Ol into the long hole 86a of the discharging member 86.

Although the upper portion of the rod 88 is formed with the flat portion 75 in this modification example, it is not particularly limited, and, for example, a flow groove 80 (see FIG. 5B) may be provided. In addition, the lattice of rods 88 can also play a role of a finger guard to prevent worker's fingers from touching the rotator 34.

As described above, also in the gutter 32B according to the second modification example, the oil mist Om can be prevented from adhering to the rotator 34, and by flowing the oil liquid Ol through the gutter 32B and the discharging member 86, it is possible to favorably lead the oil liquid Ol to the lower side than the fan 12. Therefore, malfunction of the fan 12 and the control board 16 due to adhesion of the oil liquid Ol can be suppressed so that the controller 14, the cooling device 10 and hence the machine tool can be stably operated. The gutter 32B according to the second modification example may be applied in combination with the gutter 32, the gutter 32A and/or an aftermentioned gutter 32C.

Further, the configuration of the gutter 32B is not limited to the lattice as described above. That is, various shapes capable of sparsely covering the upstream side of the fan 12 can be adopted. The sparse coverage enables the fan 12 to perform favorable air blowing. For example, as a configuration of the gutter 32B, a plurality of straight rods 88 may be arranged in parallel to each other to form a stripe arrangement.

Modification Example 3

Figure 8:
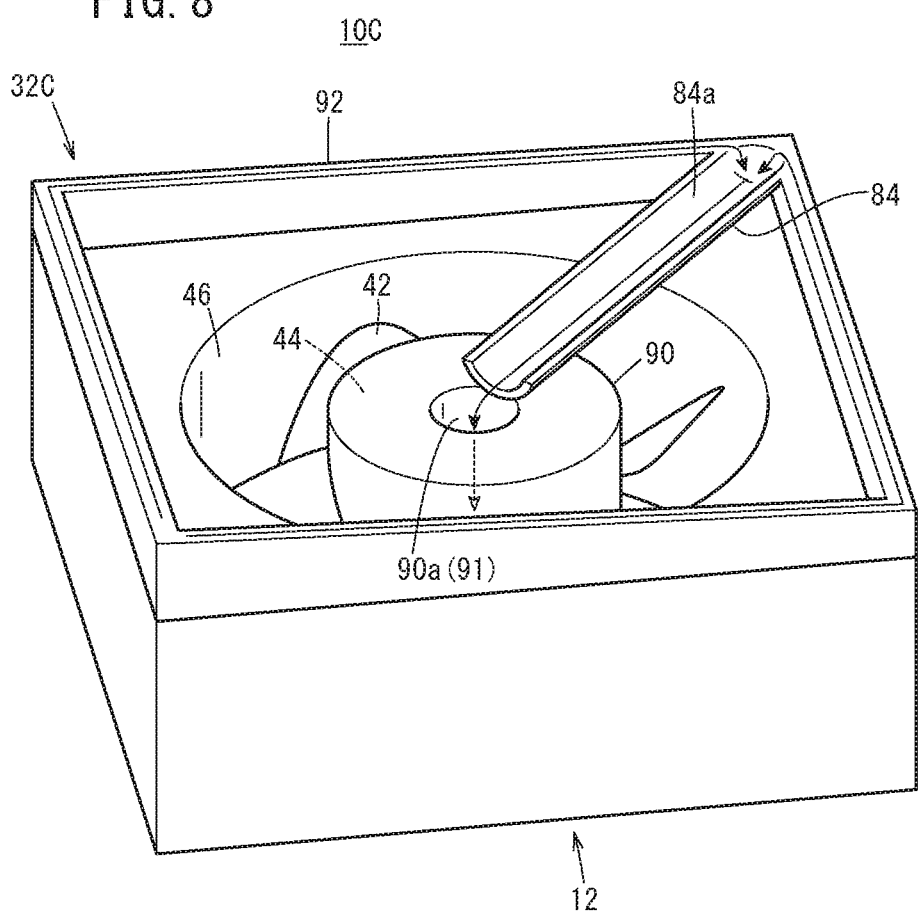
FIG. 8 is a perspective view showing a fan and a gutter of a cooling device according to a third modification example.

A cooling device 10C according to the third modification example shown in FIG. 8 is different from the above-described cooling devices 10, 10A and 10B in that gutter 32C is configured to flow the oil liquid Ol toward a pit 90a (bypass structure 91) that is formed to vertically penetrate through the axial center of a support shaft 90 for rotatably supporting the rotator 34.

The gutter 32C has, for example, a peripheral frame 92 disposed above the upper frame 48 and a semi-cylindrical member 84 joined to the peripheral frame 92. The semi-cylindrical member 84 is extended and inclined downward toward the pit 90a. Therefore, the gutter 32C can favorably lead the oil liquid Ol arising in the second space 68 of the gas-liquid separation mechanism 30 to the pit 90a.

As described above, when the oil liquid Ol is discharged by using the pit 90a provided in the support shaft 90 of the fan 12, the cooling device 10C can reduce adhesion of the oil liquid Ol to the site (motor mechanism 44) and the like for driving the rotator 34. Therefore, malfunction of the rotator 34 can be suppressed. Here, it is preferably that a drain tube 79 (see FIG. 2) for collecting the oil liquid Ol and/or another gutter (guide member) for leading the oil liquid Ol away from the control board 16 are provided on the lower side of the pit 90a of the fan 12.

The present invention is not limited to the above embodiments, and it goes without saying that various modifications can be made without departing from the scope of the present invention.

What is claimed is:

1. A cooling device, comprising:
   a casing;
   a fan configured to blow gas to a target object disposed on a downstream side of the fan by rotation of a rotator;
   a bypass structure provided in the casing so as to avoid the rotator and configured to allow a liquid to flow, at least, from an upstream side of the fan to the downstream side of the fan;
   a gutter provided above the rotator and configured to lead the liquid to the bypass structure; and a gas-liquid separation mechanism arranged on the upstream side of the fan and configured to separate the liquid contained in the gas;

wherein the gas-liquid separation mechanism contains therein a first space having a structure configured to separate the gas and the liquid from each other, and a second space communicating with the first space and configured to supply the gas having passed through the first space, to the fan, the gutter is arranged in the second space, the second space is free of any structure configured to separate the gas and the liquid from each other, the first space and the second space fill substantially an entire inner space of the gas-liquid separation mechanism from an inlet to the gutter, and the gutter is provided at an end of a gas flow flowing within the gas-liquid separation mechanism.

2. The cooling device according to claim 1, wherein an upper part of the gutter is inclined so as to become gradually lower toward the bypass structure.

3. The cooling device according to claim 1, wherein the gutter extends along a circumferential direction of the fan.

4. The cooling device according to claim 1, wherein the gutter is configured to sparsely cover the upstream side of the fan.

5. The cooling device according to claim 1, wherein a projected portion that is projected on an inner side of the gutter and extends along the gutter is provided on an upstream side of the gutter.

6. The cooling device according to claim 1, wherein the bypass structure includes a discharging member having, at a lateral side of the fan, a long hole elongated along a widthwise direction of the fan.

7. The cooling device according to claim 1, wherein the bypass structure includes a flow guide member configured to guide the liquid having flowed to the downstream side of the fan, to an inner side surface of the casing with the target object accommodated therein.

8. The cooling device according to claim 1, wherein the fan has a housing configured to accommodate the rotator in a rotatable manner, and the bypass structure is arranged in a part of the housing that is separated from the rotator and has a through hole penetrating from an upstream to a downstream of the housing.

9. The cooling device according to claim 1, wherein the gutter comprises a pair of members each having a recessed groove and a discharging member having an elongated long hole extending along the width of the fan.

10. The cooling device according to claim 1, wherein the gutter is formed by assembling rods in a lattice structure.

11. The cooling device according to claim 1, further comprising a pit formed to vertically penetrate through an axial center of a support shaft for rotatably supporting the rotator.

12. A cooling device, comprising:

a fan configured to blow gas to a target object disposed on a downstream side of the fan by rotation of a rotator;

a bypass structure provided so as to avoid the rotator and configured to allow a liquid to flow, at least, from an upstream side of the fan to the downstream side of the fan; and a gutter provided above the rotator and configured to lead the liquid to the bypass structure, wherein the fan has a housing configured to accommodate the rotator in a rotatable manner, the bypass structure is arranged in a part of the housing that is separated from the rotator and has a through hole penetrating from an upstream to a downstream of the housing, and the through hole is configured to flow the liquid that has been led from the gutter to the through hole, downward below the housing.

13. The cooling device according to claim 12, wherein the housing of the fan and the gutter are integrally molded.

14. A cooling device, comprising:

a fan configured to blow gas to a target object disposed on a downstream side of the fan by rotation of a rotator;

a bypass structure provided so as to avoid the rotator and configured to allow a liquid to flow, at least, from an upstream side of the fan to the downstream side of the fan; and, a gutter provided above the rotator and configured to lead the liquid to the bypass structure, wherein an upper part of the gutter is formed with a flat portion on an outer side in a width direction, and a projected portion protruding upward from the flat portion on an inner side in the width direction.

* * * * *